US011169583B2

(12) United States Patent
Karalnik et al.

(10) Patent No.: US 11,169,583 B2
(45) Date of Patent: Nov. 9, 2021

(54) METHODS AND APPARATUS FOR MITIGATING TEMPERATURE INCREASES IN A SOLID STATE DEVICE (SSD)

(71) Applicant: Western Digital Technologies, Inc., San Jose, CA (US)

(72) Inventors: Vladimir Karalnik, Kfar-Saba (IL); Judah Gamliel Hahn, Ofra (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 183 days.

(21) Appl. No.: 16/057,643

(22) Filed: Aug. 7, 2018

(65) Prior Publication Data
US 2020/0050246 A1 Feb. 13, 2020

(51) Int. Cl.
*G06F 1/20* (2006.01)
*G06F 1/3287* (2019.01)
(Continued)

(52) U.S. Cl.
CPC .............. *G06F 1/206* (2013.01); *F25B 21/02* (2013.01); *G06F 1/3287* (2013.01); *H05K 1/0203* (2013.01); *F24F 2140/60* (2018.01); *F25B 2321/0212* (2013.01); *H05K 1/181* (2013.01); *H05K 2201/066* (2013.01); *H05K 2201/10159* (2013.01); *H05K 2201/10219* (2013.01);
(Continued)

(58) Field of Classification Search
CPC ........ G06F 1/206; G06F 1/3287; F25B 21/02; F25B 2321/0212; H05K 1/0203; H05K 1/181; H05K 2201/066; H05K 2201/10159; H05K 2201/10219; H05K 2201/10409; H05K 2201/10515; H05K 2201/10522; H01L 35/32; H01L 35/30
USPC ......................................................... 700/300
See application file for complete search history.

(56) References Cited

U.S. PATENT DOCUMENTS 6,250,085 B1 * 6/2001 Tousson .................. H01L 23/38
257/E23.082
6,574,740 B1 * 6/2003 Odaohhara ............... G06F 1/32
713/323

(Continued)

*Primary Examiner* — Rocio Del Mar Perez-Velez
*Assistant Examiner* — Alicia M. Choi
(74) *Attorney, Agent, or Firm* — Loza & Loza, LLP; Gabriel Fitch

(57) ABSTRACT

The present disclosure, in various aspects, describes technologies and techniques for a controller of a data storage device to mitigate temperature increases in the data storage device. In one example, the controller receives a command for a memory operation, analyzes the command to determine whether execution of the command with thermal throttling would have a negative impact on a user experience, and activates, if performing the thermal throttling would have the negative impact on the user experience, one or more thermoelectric cooler (TEC) devices while refraining from performing the thermal throttling. In another example, the controller monitors a temperature of one or more regions of the data storage device, determines whether the temperature exceeds a threshold temperature, activates one or more TEC devices to mitigate the temperature when the temperature exceeds the threshold temperature, and deactivates any activated TEC devices when the temperature no longer exceeds the threshold temperature.

29 Claims, 12 Drawing Sheets

(51) Int. Cl.
*H05K 1/02* (2006.01)
*F25B 21/02* (2006.01)
*H05K 1/18* (2006.01)
*F24F 140/60* (2018.01)

(52) U.S. Cl.
CPC .............. *H05K 2201/10409* (2013.01); *H05K 2201/10515* (2013.01); *H05K 2201/10522* (2013.01)

(56) References Cited

U.S. PATENT DOCUMENTS

| | | | |
|---|---|---|---|
| 7,318,130 B2 | 1/2008 | Morrow et al. | |
| 8,184,439 B2 | 5/2012 | Baek et al. | |
| 2006/0112250 A1* | 5/2006 | Walker ................ | G06F 13/1694 711/167 |
| 2006/0179333 A1* | 8/2006 | Brittain ................. | G11C 5/143 713/320 |
| 2011/0161554 A1 | 6/2011 | Selinger et al. | |
| 2012/0031453 A1* | 2/2012 | Rao ......................... | F25B 21/02 136/242 |
| 2012/0331207 A1 | 12/2012 | Lassa et al. | |
| 2012/0331282 A1 | 12/2012 | Yurzola et al. | |
| 2013/0291555 A1* | 11/2013 | Edwards .................. | F25B 21/04 62/3.2 |
| 2014/0005854 A1 | 1/2014 | Lim et al. | |
| 2015/0089961 A1* | 4/2015 | Duzly ...................... | G11C 7/04 62/3.3 |
| 2016/0033975 A1* | 2/2016 | Mittal ................. | G05D 23/1917 700/300 |
| 2016/0170642 A1 | 6/2016 | Miyamoto et al. | |
| 2016/0320971 A1* | 11/2016 | Postavilsky ........... | G06F 3/0659 |
| 2017/0023281 A1* | 1/2017 | Fromm ................... | F25B 21/04 |
| 2017/0038805 A1* | 2/2017 | Chun ...................... | G06F 1/206 |
| 2017/0212562 A1* | 7/2017 | Wang .................. | G06F 11/0757 |
| 2018/0343186 A1* | 11/2018 | Milanese ............ | H04L 41/5009 |
| 2018/0358080 A1* | 12/2018 | Huang .................... | G11C 7/04 |

\* cited by examiner

METHODS AND APPARATUS FOR MITIGATING TEMPERATURE INCREASES IN A SOLID STATE DEVICE (SSD)

FIELD

The present disclosure, in various embodiments, relates to data storage systems, such as solid state devices (SSDs). More specifically, the present disclosure relates to approaches for mitigating temperature increases in SSDs.

INTRODUCTION

Data storage devices, such as solid state devices (SSDs), may generate a significant amount of heat during operation. In the case of SSDs, for example, a controller of an SSD may be instructed (e.g., by a host device) to execute a series of memory operations (e.g., read, write, etc.) with respect to one or more non-volatile memory devices (e.g., NAND Flash memory devices). Rapid execution of these memory operations to meet the performance demands of the end user may cause excess heat to build up in the SSD. Such excess heat may raise the temperature of the SSD to a critical temperature (e.g., a temperature at which the SSD shuts off to prevent damage to the components of the SSD), thereby negatively impacting performance.

In one example approach to mitigate temperature increases in an SSD, the controller of an SSD may be configured to momentarily cease execution of memory operations when a certain temperature is reached in order to allow the SSD to cool down. However, such pauses are likely to have a negative impact on performance. Therefore, improved techniques for mitigating temperature increases in SSDs are needed.

SUMMARY

One aspect of the present disclosure provides a controller configured to manage a temperature of an SSD. In one example, the controller comprises a processor configured to: monitor a temperature of one or more regions of the SSD; determine whether the temperature exceeds a threshold temperature; activate one or more thermoelectric cooler (TEC) devices to mitigate the temperature when the temperature exceeds the threshold temperature; and deactivate the one or more thermoelectric cooler (TEC) devices that have been activated when the temperature no longer exceeds the threshold temperature.

Another aspect of the present disclosure provides a controller configured to manage a temperature of an SSD. In one example, the controller comprises a processor configured to: monitor a temperature of one or more regions of the SSD; determine whether the temperature exceeds at least one of a first threshold temperature or a second threshold temperature, wherein the second threshold temperature is greater than the first threshold temperature; activate one or more thermoelectric cooler (TEC) devices when the temperature exceeds at least one of the first threshold temperature or the second threshold temperature, wherein the one or more TEC device are activated using a first TEC activation configuration when the temperature exceeds the first threshold temperature, and wherein the one or more TEC devices are activated using a second TEC activation configuration when the temperature exceeds the second threshold temperature.

Another aspect of the present disclosure provides an apparatus configured to manage a temperature of an SSD. In one example, the apparatus comprises means for monitoring a temperature of one or more regions of the SSD; means for determining whether the temperature exceeds a threshold temperature; means for mitigating the temperature based on thermoelectric cooling; and means for activating the means for mitigating the temperature when the temperature exceeds a threshold temperature.

Another aspect of the present disclosure provides a method of operating a controller to manage a temperature of a solid state device (SSD). In one example, the method comprises: receiving a command for a memory operation; analyzing the command to determine whether execution of the command with thermal throttling would have a negative impact on a user experience; and activating, if execution of the command with the thermal throttling would have the negative impact on the user experience, one or more thermoelectric cooler (TEC) devices while refraining from performing the thermal throttling.

Another aspect of the present disclosure provides a method of operating a controller to manage a temperature of an SSD. In one example, the method comprises: receiving a command for a memory operation; determining a memory operation workload of the controller; activating one or more thermoelectric cooler (TEC) devices when the memory operation workload of the controller exceeds at least one of a first workload threshold or a second workload threshold, wherein the second workload threshold is greater than the first workload threshold; and executing the command, wherein the command is executed while refraining from performing thermal throttling when the memory operation workload exceeds the first workload threshold, and wherein the command is executed with thermal throttling when the memory operation workload exceeds the second workload threshold.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Figure 1:
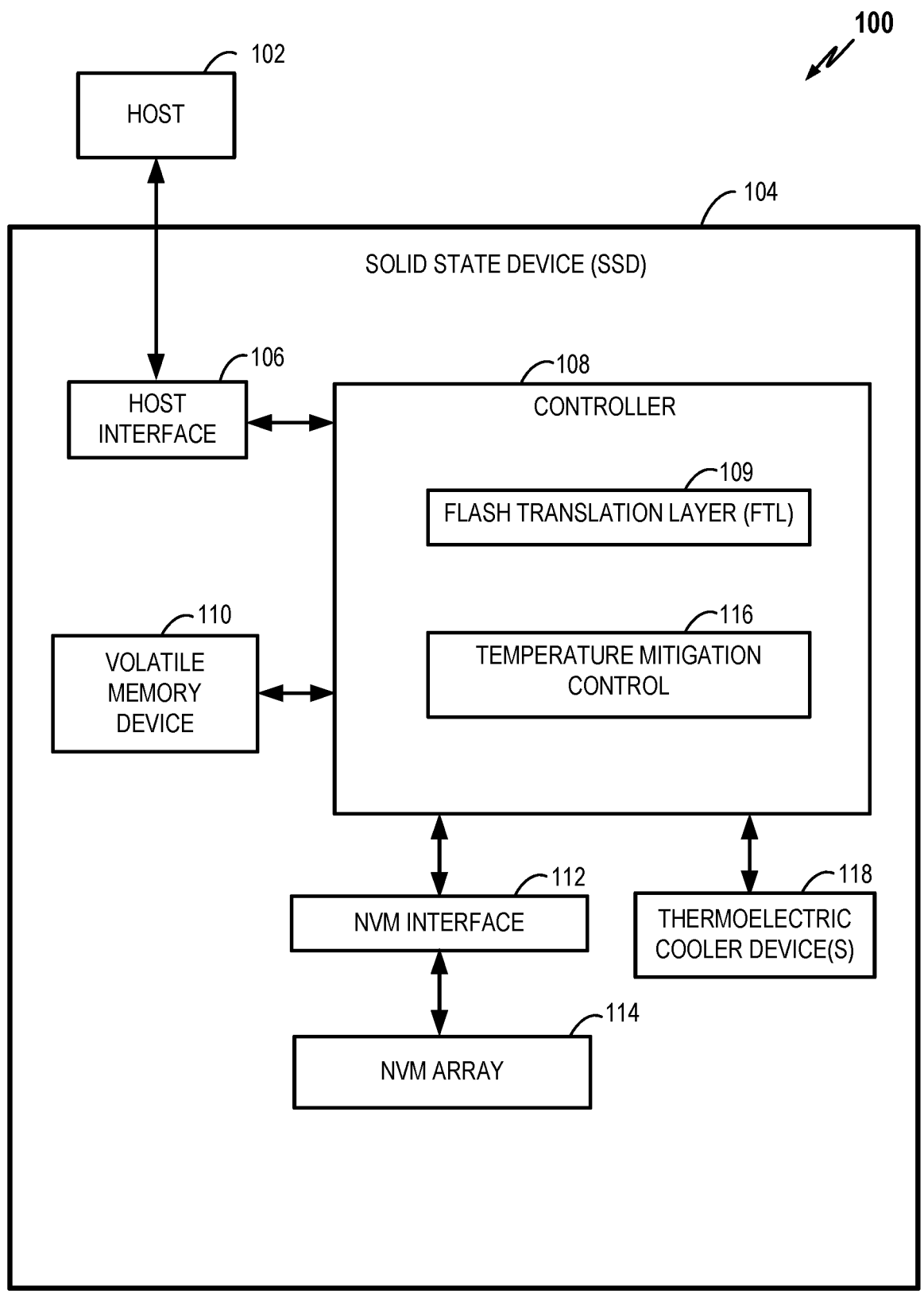
FIG. 1 is a block diagram of a system including an exemplary solid state device (SSD) in accordance with aspects of the disclosure.

FIG. 1 is a block diagram of a system 100 including an exemplary solid state device (SSD) in accordance with aspects of the disclosure. The system 100 includes a host device 102 and an SSD 104 coupled to the host device 102. In some aspects of the disclosure, the SSD 104 may be a solid state drive. The host device 102 provides commands to the SSD 104 for transferring data between the host device 102 and the SSD 104. For example, the host device 102 may provide a write command to the SSD 104 for writing data to the SSD 104 or read command to the SSD 104 for reading data from the SSD 104. The host device 102 may be any system or device having a need for data storage or retrieval and a compatible interface for communicating with the SSD 104. For example, the host device 102 may a computing device, a personal computer, a portable computer, a workstation, a server, a personal digital assistant, a digital camera, or a digital phone as merely a few examples.

The SSD 104 includes a host interface 106, a controller 108 (or alternatively, an NVM controller 108 or memory controller 108), which also includes a flash translation layer (FTL) 109 and a temperature mitigation control 116, a volatile memory device 110 (e.g., a random access memory (RAM) device), a non-volatile memory (NVM) interface 112 (which may also be referred to as a Flash memory interface in one aspect), a non-volatile memory device (NVM or NVM device) 114 (e.g., a NAND Flash memory), and thermoelectric cooler (TEC) device(s) 118. The host interface 106 is coupled to the controller 108 and facilitates communication between the host device 102 and the controller 108. Additionally, the controller 108 is coupled to the volatile memory device 110, the NVM 114 via the NVM interface 112, and the TEC device(s) 118. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, a Peripheral Component Interconnect Express PCI/PCIe interface, an NVME over Fabric (NVMEoF) interface, or the like. In some embodiments, the host device 102 includes the SSD 104. In other embodiments, the SSD 104 is remote with respect to the host device 102 or is contained in a remote computing system communicatively coupled with the host device 102. For example, the host device 102 may communicate with the SSD 104 through a wireless communication link.

The controller 108 controls operation of the SSD 104. In various aspects, the controller 108 receives commands from the host device 102 through the host interface 106 and performs the commands to transfer data between the host device 102 and the NVM 114. Furthermore, the controller 108 may manage reading from and writing to the volatile memory device 110 for performing the various functions effected by the controller and to maintain and manage cached information stored in the volatile memory device 110.

The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host device 102. In still further aspects, some or all of the functions described herein as being performed by the controller 108 may instead be performed by another element such as a controller in a hybrid drive including both non-volatile memory elements and magnetic storage elements.

The volatile memory device 110 may be any memory, computing device, or system capable of storing data. For example, the memory 110 may be a random-access memory (RAM), a dynamic random-access memory (DRAM), a double data rate (DDR) DRAM, a static random-access memory (SRAM), a synchronous dynamic random-access memory (SDRAM), a flash storage, an erasable programmable read-only-memory (EPROM), an electrically erasable programmable read-only-memory (EEPROM), or the like. In various aspects of the disclosure, the controller 108 uses the volatile memory device 110, or a portion thereof, to store data during the transfer of data between the host device 102 and the NVM 114. For example, the volatile memory device 110 or a portion of the volatile memory device 110 may be a cache memory.

The NVM 114 receives data from the controller 108 via the NVM interface 112 and stores the data. The NVM 114 may be any type of non-volatile memory, such as a flash storage system, a NAND-type flash memory, a flash memory card, a secure digital (SD) card, a universal serial bus (USB) memory device, a CompactFlash card, a SmartMedia device, a flash storage array, or the like.

In the example of FIG. 1, read requests will generally comprise a request from the host device 102 via the interface 106 to read the data within a given logical block address associated with the NVM 114. Each logical block address is associated with a specific physical address within the NVM 114 through the use of the Logical to Physical (L2P) table maintained by the system controller 108, and more particularly by the FTL 109. In general, the table maps each logical block address to a physical block address within the NVM 114. The use of logical block addresses and a logical-to-physical block address conversion allows the controller 108 to effectively manage the memory within the NVM 114 and to implement various mapping and mechanisms.

In a further aspect, the FTL 109 may include an address translator for effectuating the translation between logical and physical addresses, as well as to, in part, implement the L2P table. Furthermore, the FTL 109 may include a garbage collector process, module, or algorithm that copies valid data into new or free areas and erases invalid data in physical block locations of the NVM 114 in order to free this invalid memory space. Still further, the FTL 109 may include a wear leveler process, module, or algorithm used to ensure that erasures and re-writes are distributed evenly across the NVM 114.

Figure 2:
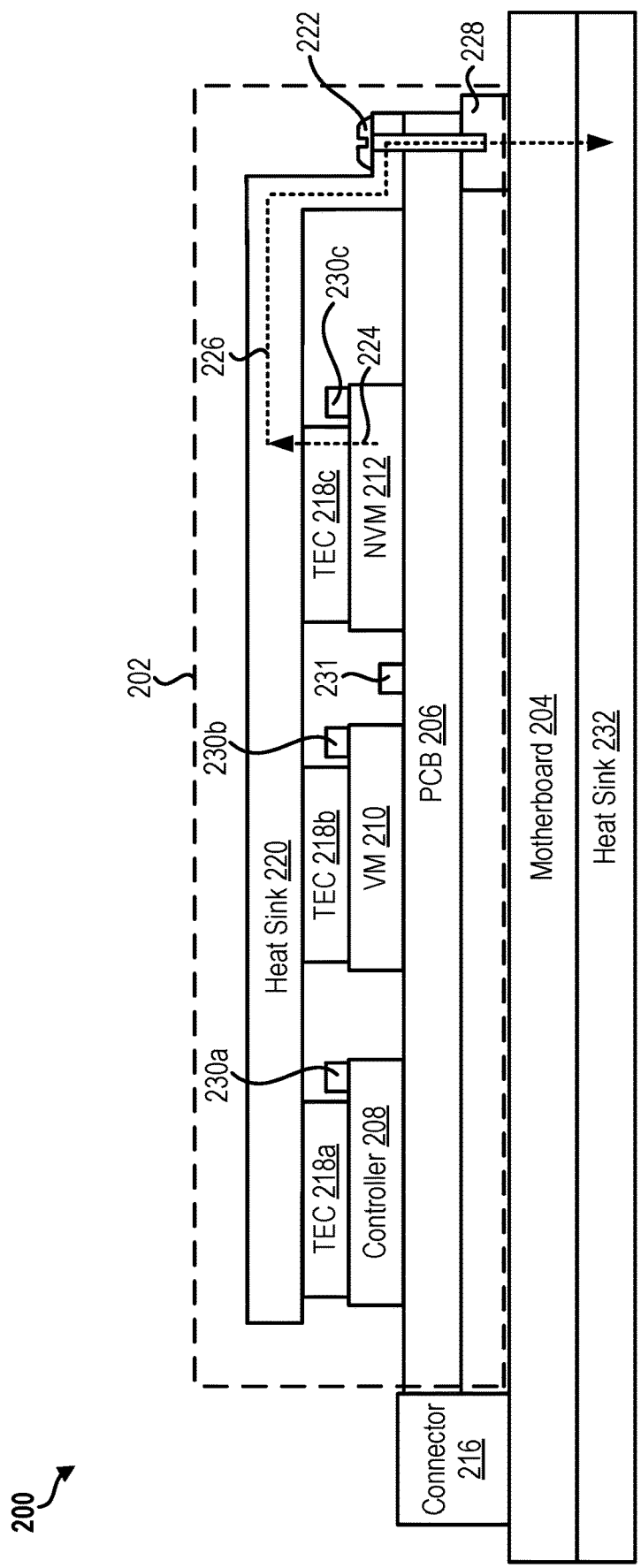
FIG. 2 is a side view of an exemplary system including an exemplary SSD in accordance with some aspects of the disclosure.

Aspects of the present disclosure provide various apparatus, devices, systems and methods for mitigating (e.g., cooling) the temperature of solid state devices (SSDs). FIG. 2 is a side view of an exemplary system 200 including an exemplary SSD 202 in accordance with some aspects of the disclosure. For example, the system 200 may be a computing device, such as a smartphone, a laptop computer, or other suitable computing device. As shown in FIG. 2, the SSD 202 may be mounted on a motherboard 204 (also referred to as a mainboard) of the system 200 via a connector 216. For example, the connector 216 may be a Serial Advanced Technology Attachment (SATA) connector or other appropriate connector that enables communication of electronic signals between the SSD 202 and one or more devices (not shown) that may be installed on the motherboard 204, such as a processing device (e.g., a central processing unit (CPU)).

As shown in FIG. 2, the SSD 202 includes a controller 208, a volatile memory (VM) device 210, and a non-volatile memory (NVM) device 212 installed on a printed circuit board (PCB) 206. For example, the volatile memory device 210 may be a double data rate (DDR) synchronous dynamic random-access memory (SRAM) device, and the NVM device 212 may be a NAND Flash memory device (e.g., a NAND Flash memory chip). As shown in FIG. 2, the SSD 202 may further include one or more thermoelectric cooler (TEC) devices, such as TEC devices 218a, 218b, and 218c. For example, each of the TEC devices 218a, 218, 218 may be a Peltier device. In some aspects, each of the TEC devices 218a, 218b, 218c may be installed on or near a respective component (e.g., a component that generates a significant amount of heat during operation) of the SSD 202. For example, in the configuration shown in FIG. 2, the TEC device 218a may be installed on or over at least a portion of the controller 208, the TEC device 218b may be installed on or over at least a portion of the volatile memory device 210, the TEC device 218c may be installed on or over at least a portion of the non-volatile memory device 212. In the aspects described herein, the TEC 218a may be thermally coupled to the controller 208, the TEC device 218b may be thermally coupled to the volatile memory device 210, and the TEC device 218c may be thermally coupled to the non-volatile memory device 212. For example, such thermal coupling may be achieved by providing a heat conductive path between a component of the SSD 202 (e.g., the controller 208) and a corresponding TEC (e.g., the TEC 218a) for purposes of transferring excess heat from the component to the corresponding TEC. In some aspects, as shown in FIG. 2, each of the TEC devices 218a, 218b, 218c may be thermally coupled to a first heat sink 220. For example, the first heat sink 220 may include one or more materials that have a high thermal conductivity, such as copper and/or aluminum. In some aspects, a thermal interface material may be applied between the TEC devices 218a, 218b, 218c and the heat sink 220 to improve heat transfer from the TEC devices 218a, 218b, 218c to the heat sink 220. In some aspects, the SSD 202 may include one or more temperature sensors, such as the temperature sensors 230a, 230b, and 230c. In some aspects of the disclosure, the one or more temperature sensors are configured to measure temperature at one or more regions of the SSD known to generate more heat relative to other regions of the SSD. In the example configuration of FIG. 2, the temperature sensor 230a is configured to measure the temperature at or near the controller 208, the temperature sensor 230b is configured to measure the temperature at or near the volatile memory device 210, and the temperature sensor 230c is configured to measure the temperature at or near the non-volatile memory device 212. In some aspects of the disclosure, the controller 208 may correspond to the controller 108 in FIG. 1, the volatile memory device 210 may correspond to the volatile memory device 110 in FIG. 1, the non-volatile memory device 212 may correspond to the non-volatile memory device 114 in FIG. 1, and one or more of the TEC devices 218a, 218b, 218c may correspond to the TEC device(s) 118 in FIG. 1.

In one example, during operation of the SSD 202, one or more of the TEC devices 218a, 218b, 218c may be activated (e.g., turned on) to cool one or more of the corresponding components of the SSD 202. For example, as shown in FIG. 2, the TEC 218c may be activated to transfer heat (e.g., indicated with arrow 224 in FIG. 2) from the non-volatile memory device 212 to the first heat sink 220. In some aspects, the first heat sink 220 may be thermally coupled to the motherboard 204. For example, in the configuration of system 200, the first heat sink 220 may be thermally coupled to the motherboard 204 via a fastening device 222 (e.g., a screw) and a PCB mounting stand 228. In some aspects, the system 200 may further include a second heat sink 232 that may be thermally coupled to the motherboard 204. In such aspects, and as shown in FIG. 2, heat accumulated at the first heat sink 220 may be transferred (indicated with arrow 226 in FIG. 2) to the second heat sink 232 via the fastening device 222, the PCB mounting stand 228, and the motherboard 204.

In some aspects of the disclosure, the controller 208 may be configured to mitigate the temperature of the SSD 202 based on a command (e.g., read, write, etc.) for performing a memory operation. For example, the command may be an input/output (I/O) command from a host device, such as a command to read data from the non-volatile memory device 212. In such aspects, the controller 208 may not rely on temperature measurements of the SSD 202 to mitigate the temperature (e.g., also referred to as the composite temperature or the operating temperature) of the SSD 202. In one approach, for example, the controller 208 may receive a command and may analyze the command to determine whether execution of the command with the use of thermal throttling techniques would have a negative impact on the user experience. As described in detail herein, if the execution of the command with the use of thermal throttling techniques would have a negative impact on the user experience, the controller 208 may refrain from performing the thermal throttling techniques and may use other temperature mitigation techniques (e.g., activating one or more of the TEC devices 218a, 218b, 218c). For example, a negative impact on the user experience may be a perceivable performance degradation of a user application executing on a host device.

In some aspects of the disclosure, the controller may analyze the command to determine whether execution of the command with the use of thermal throttling techniques would have a negative impact on the user experience by comparing a known or expected execution duration of the command to a threshold execution duration. The controller may determine that execution of the command with thermal throttling would have a negative impact on the user experience when the known or expected execution duration exceeds the threshold execution duration, or may determine that the execution of the command with the thermal throttling would not have the negative impact on the user experience when the known or expected execution duration is less than or equal to the threshold execution duration. In some aspects of the disclosure, the controller may select the threshold execution duration based on the application (e.g., the type of application) executing on the host. For example, if the application is a gaming type application, the controller may select a first threshold execution duration, whereas if the application is a word processing type application, the controller may select a second threshold execution duration that is greater than the first threshold execution duration. If the controller 208 determines that the use of thermal throttling techniques would have a negative impact on the user experience, the controller 208 may activate one or more of the TEC devices 218a, 218b, 218c and refrain from performing the thermal throttling techniques. Therefore, in this approach, the controller 208 may mitigate the temperature of the SSD 202 without compromising the performance of the SSD 202 and/or the host device. In some aspects of the disclosure, the controller 208 may control the power delivered to the one or more of the TEC devices 218a, 218b, 218c to increase or decrease the cooling effect of the one or more TEC devices 218a, 218b, 218c.

In some aspects of the disclosure, the controller 208 may analyze the command to determine whether execution of the command with the use of thermal throttling techniques would have a negative impact on the user experience by determining an operation type (e.g., read versus write), stream type (e.g., random versus sequential), block size of data associated with the command (e.g., large versus small), and queue parameters associated with the command (e.g., queue utilization and/or depth). The controller 208 may parse the command to identify the command and the operation that needs to be performed.

In one example, the controller 208 may identify that the command is for reading data from the non-volatile memory device 212 or for writing data to the non-volatile memory device 212. Delays in read operations typically have more of a negative impact than delays in write operations, because a user usually expects something to happen in response to a read command (e.g., waiting for the results of a browsing operation). Also, a host generally does not wait for write operations to complete. Thus, slow writes may not impact the user experience as significantly as slow reads. Therefore, in some aspects, the controller 208 may be configured to consider a read command as having a negative impact on the user experience, and may consider a write command to not have a negative impact on the user experience.

In another example, the controller 208 may determine whether execution of the command with the use of thermal throttling techniques would have a negative impact on the user experience by analyzing a stream of commands and determining a stream type. If the stream type is random, the controller 208 may determine that the command is from a user, as random streams are often an indicator of user behavior. In such a case, the controller 208 may execute the command without thermal throttling to avoid any delays that may be perceived by the user. However, if the stream type is sequential, the controller 208 may execute the command with thermal throttling (e.g., by inserting a delay), as a sequential stream is typically an indicator of an application and not a user. Therefore, the controller 208 may execute random commands without thermal throttling, but may execute sequential commands with thermal throttling. This approach is also based on the consideration that a long sequence may generate a significant thermal impact, while short random operations are less likely to impact temperature.

In some aspects of the disclosure, the controller 208 may be configured to mitigate the temperature of the SSD 202 based on temperature measurements from one or more regions of the SSD 202. For example, the controller 208 may obtain temperature measurements at or near the controller 208, the volatile memory device 210, and/or the non-volatile memory device 212. In one example approach, the controller 208 may determine whether any of the obtained temperature measurements exceed a threshold temperature. If the obtained temperature measurements exceed the threshold temperature, the controller 208 may be configured to activate one or more of the TEC devices 218a, 218b, 218c to reduce the temperature to less than or equal to the threshold temperature or at least reduce the rate at which the temperature of the SSD 202 increases. In one aspect, the controller 208 may determine whether the obtained temperature measurements corresponding to a particular component in the SSD 202 exceeds a threshold temperature. For example, the controller 208 may determine whether the temperature measurements at or near the non-volatile memory device 212 obtained from the temperature sensor 230c exceeds a threshold temperature. If the temperature measurements exceed the threshold temperature, the controller 208 may be configured to activate the TEC 218c corresponding to the non-volatile memory device 212 in to reduce the temperature at or near the non-volatile memory device 212 to less than or equal to the threshold temperature. In some aspects, when the controller 208 determines that the temperature measurements are less than or equal to the threshold temperature during activation of one or more of the TEC devices 218a, 218b, 218c, the controller 208 may deactivate one or more of the TEC devices 218a, 218b, 218c. In some aspects, the controller 208 may deactivate one or more of the TEC devices 218a, 218b, 218c until the controller 208 detects a temperature measurement that exceeds the threshold temperature. It should be appreciated that by deactivating the one or more of the TEC devices 218a, 218b, 218c during periods when the temperature does not exceed the threshold temperature, the power consumption of the SSD 202 may be reduced.

In another example approach, the controller 208 may determine whether temperature measurements from one or more regions of the SSD 202 exceed one or more threshold temperatures from among a set of threshold temperatures. For example, the controller 208 may obtain temperature measurements at or near the controller 208, the volatile memory device 210, and/or the non-volatile memory device 212. For example, the set of threshold temperatures may include a first threshold temperature and a second threshold temperature, where the second threshold temperature is greater than the first threshold temperature. In one example scenario, the controller 208 may determine whether the obtained temperature measurements exceed the first threshold temperature without exceeding the second threshold temperature. If the obtained temperature measurements exceed the first threshold temperature without exceeding the second threshold temperature, the controller 208 may be configured to activate one or more of the TEC devices 218a, 218b, 218c using a first TEC activation configuration to reduce the temperature to less than or equal to the first threshold temperature. For example, the first TEC activation configuration may activate one or more of the TEC devices 218a, 218b, 218c by delivering a first amount of power to one or more of the TEC devices 218a, 218b, 218c. In another example scenario, the controller 208 may determine whether the obtained temperature measurements exceed the second threshold temperature. If the obtained temperature measurements exceed the second threshold temperature, the controller 208 may be configured to activate one or more of the TEC devices 218a, 218b, 218c using a second TEC activation configuration to reduce the temperature to less than or equal to the second threshold temperature. For example, the second TEC activation configuration may activate one or more of the TEC devices 218a, 218b, 218c by delivering a second amount of power to one or more of the TEC devices 218a, 218b, 218c. In this example, the second amount of power may be greater than the first amount of power. In one aspect, the first amount of power may be delivered by applying a first voltage level to one or more of the TEC devices 218a, 218b, 218c, and the second amount of power may be delivered by applying a second voltage level to one or more of the TEC devices 218a, 218b, 218c, where the second voltage level is greater than the first voltage level. It should be understood that the second TEC activation configuration enables one or more of the TEC devices 218a, 218b, 218c to provide a greater cooling effect as compared to the first TEC activation configuration.

Figure 3:
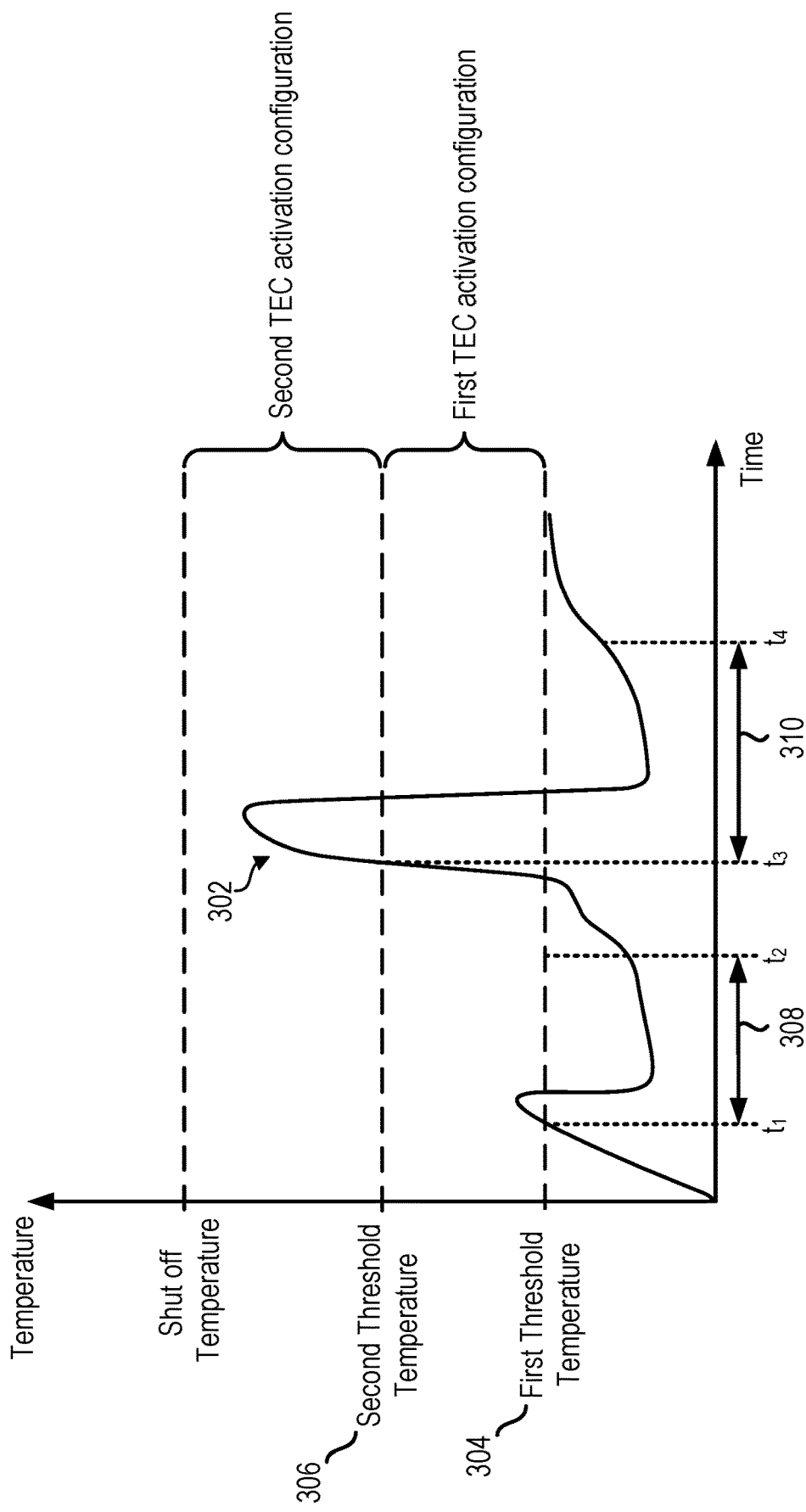
FIG. 3 illustrates the temperature of a non-volatile memory device with respect to time in one example scenario.

In one aspect, the controller 208 may determine whether any of the obtained temperature measurements corresponding to a particular component in the SSD 202 exceeds one or more threshold temperatures from among a set of threshold temperatures. With reference to FIG. 3, which illustrates the temperature 302 of the non-volatile memory device 212 with respect to time in one example scenario, the set of threshold temperatures may include a first threshold temperature 304 and a second threshold temperature 306, where the second threshold temperature 306 is greater than the first threshold temperature 304. In one example scenario, the controller 208 may determine whether any temperature measurements at or near the non-volatile memory device 212 obtained from the temperature sensor 230c exceeds the first threshold temperature 304 and/or the second threshold temperature 306. If the obtained temperature measurements exceed the first threshold temperature 304 (e.g., at approximately $t_1$ in FIG. 3), but not the second threshold temperature 306, the controller 208 may be configured to activate the TEC 218c (e.g., corresponding to the non-volatile memory device 212) using the first TEC activation configuration in order to reduce the temperature at or near the non-volatile memory device 212 to less than or equal to the first threshold temperature 304. In another example scenario, the controller 208 may determine whether any temperature measurements at or near the non-volatile memory device 212 obtained from the temperature sensor 230c exceed the second threshold temperature 306. If any of the obtained temperature measurements exceeds the second threshold temperature 306 (e.g., at approximately $t_3$ in FIG. 3), the controller 208 may be configured to activate the TEC 218c (e.g., corresponding to the first non-volatile memory device 214) using the second TEC activation configuration in order to reduce the temperature at or near the non-volatile memory device 212 to less than or equal to the second threshold temperature. It should be understood that the second TEC activation configuration enables the TEC device 218c to provide a greater cooling effect as compared to the first TEC activation configuration. In some aspects of the disclosure, the controller 208 may activate the TEC device 218c for a first period of time 308 if the obtained temperature measurements exceed the first threshold temperature 304, and may activate the TEC device 218c for a second period of time 310 if the obtained temperature measurements exceed the second threshold temperature 306. For example, the first period of time 308 may be different from the second period of time 310. In some aspects, the length of the first period of time 308 and/or the length of the second period of time 310 may be preconfigured at the controller 208 or dynamically provided to the controller 208.

In some aspects of the disclosure, the controller 208 may be configured to mitigate the temperature of the SSD 202 based on a memory operation workload of the controller 208. In such aspects, the controller 208 may determine a workload of the controller 208 and may determine whether the workload exceeds one or more workload thresholds from among a set of workload thresholds. In some aspects, the controller 208 may determine the memory operation workload by determining at least one of a power consumption of the controller 208, a total number of command queues of the controller 208 that have reached a maximum capacity, a total number of queued commands at the controller 208, or a data throughput of the controller 208.

For example, the controller 208 may determine whether the workload exceeds a first workload threshold and/or a second workload threshold, where the controller 208 is configured to perform a first temperature mitigation operation when the first workload threshold is exceeded and where the controller 208 is configured to perform a second temperature mitigation operation when the second workload threshold is exceeded. In some aspects, the first workload threshold may be exceeded when more than a first number of the command queues of the controller 208 have reached maximum capacity, and the second workload threshold may be exceeded when more than a second number of the command queues of the controller 208 have reached maximum capacity. For example, the second number may be greater than the first number.

In one example scenario, the controller 208 may determine that the workload of the controller 208 exceeds a first workload threshold without exceeding a second workload threshold. If the workload exceeds the first workload threshold without exceeding the second workload threshold, the controller 108 may be configured to perform the first temperature mitigation operation by activating one or more of the TEC devices 218a, 218b, 218c and refraining from performing thermal throttling (e.g., during execution of a command for a memory operation) to avoid a negative impact on the user experience. In another example scenario, the controller 208 may determine that the workload exceeds the second workload threshold. If the workload exceeds the second workload threshold, the controller 208 may be configured to perform the second temperature mitigation operation by activating one or more of the TEC devices 218a, 218b, 218c and also performing thermal throttling (e.g., when executing a command for a memory operation) to prevent the SSD 202 from reaching a critical temperature (e.g., a shutoff temperature) and thereby avoid damage to the components of the SSD 202. In some aspects, the controller 208 may provide a first amount of power to one or more of the TEC devices 218a, 218b, 218c when the memory operation workload of the controller 208 exceeds the first workload threshold, and may provide a second amount of power to one or more of the TEC devices 218a, 218b, 218c when the memory operation workload of the controller exceeds the second workload threshold. For example, the second amount of power is greater than the first amount of power.

Figure 4:
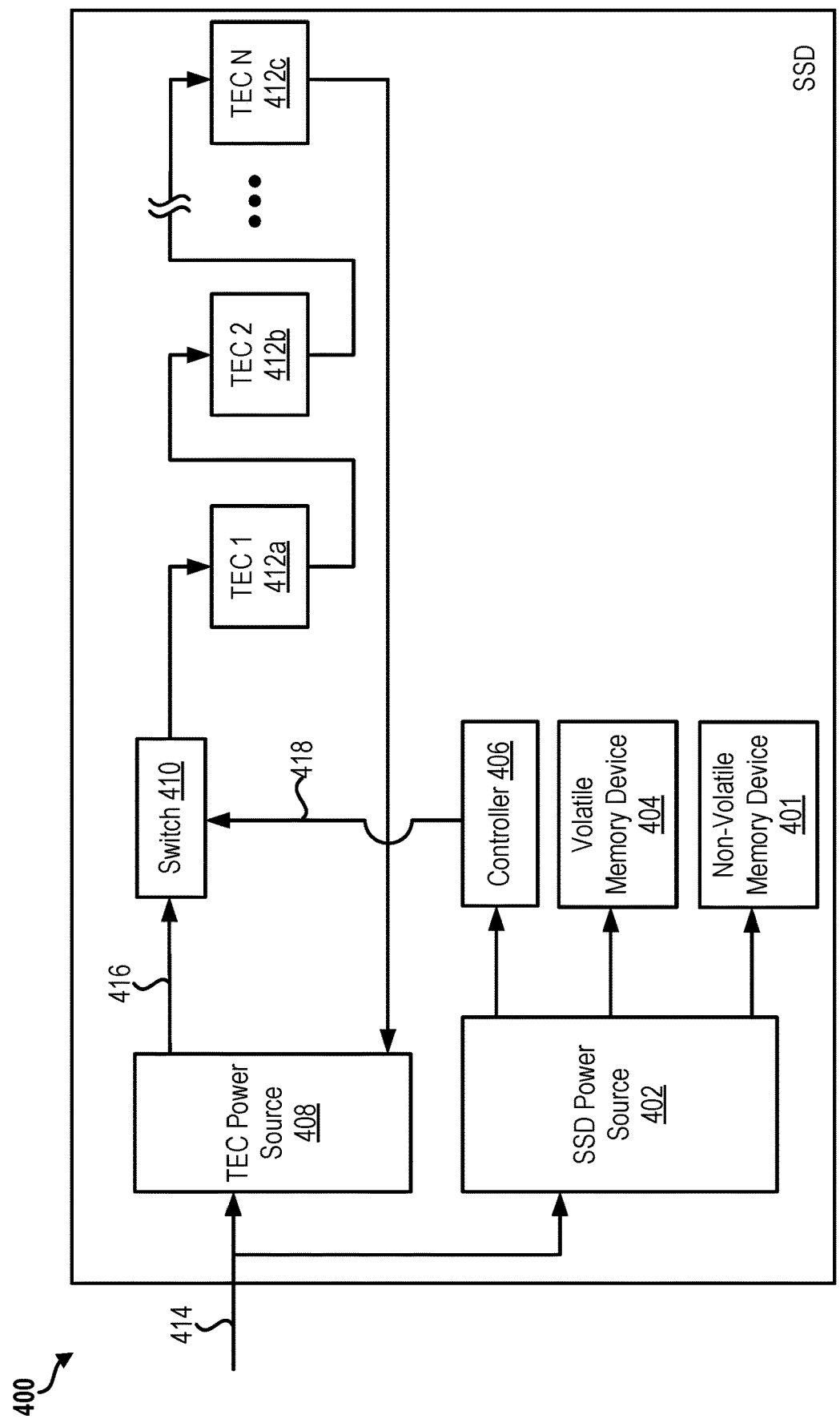
FIG. 4 is a block diagram of an exemplary SSD in accordance with some aspects of the disclosure.

FIG. 4 is a block diagram of an exemplary solid state device (SSD) 400 in accordance with some aspects of the disclosure. As shown in FIG. 4, the SSD 400 includes an SSD power source 402, a non-volatile memory device 401, a volatile memory device 404, a controller 406, a thermoelectric cooler (TEC) power source 408, a switch 410, and thermoelectric cooler (TEC) devices 412a, 412b, and 412c. The SSD power source 402 may receive input power 414 and may provide power to components of the SSD 400, such as the controller 406, the non-volatile memory device 401, and the volatile memory device 404. In the aspect shown in FIG. 4, the TEC devices 412a, 412b, and 412c are coupled to the TEC power source 408 in a serial configuration via the switch 410. Therefore, the serially coupled TEC devices 412a, 412b, 412c may be activated when the switch 410 is closed (e.g., when the switch 410 is activated or turned ON) and power 416 from the TEC power source 408 is provided to the TEC devices 412a, 412b, 412c. In some aspects of the disclosure, the controller 406 may activate or deactivate the TEC devices 412a, 412b, 412c by opening or closing the switch 410 via the signal 418. In some aspects of the disclosure, the non-volatile memory device 401 in FIG. 4 may correspond to the non-volatile memory device 212 in FIG. 2, the volatile memory device 404 in FIG. 4 may correspond to the volatile memory device 210 in FIG. 2, the controller 406 in FIG. 4 may correspond to the controller 208 in FIG. 2, and the TEC devices 412a, 412b, 412c in FIG. 4 may respectively correspond to the TEC devices 218a, 218b, 218c in FIG. 2.

Figure 5:
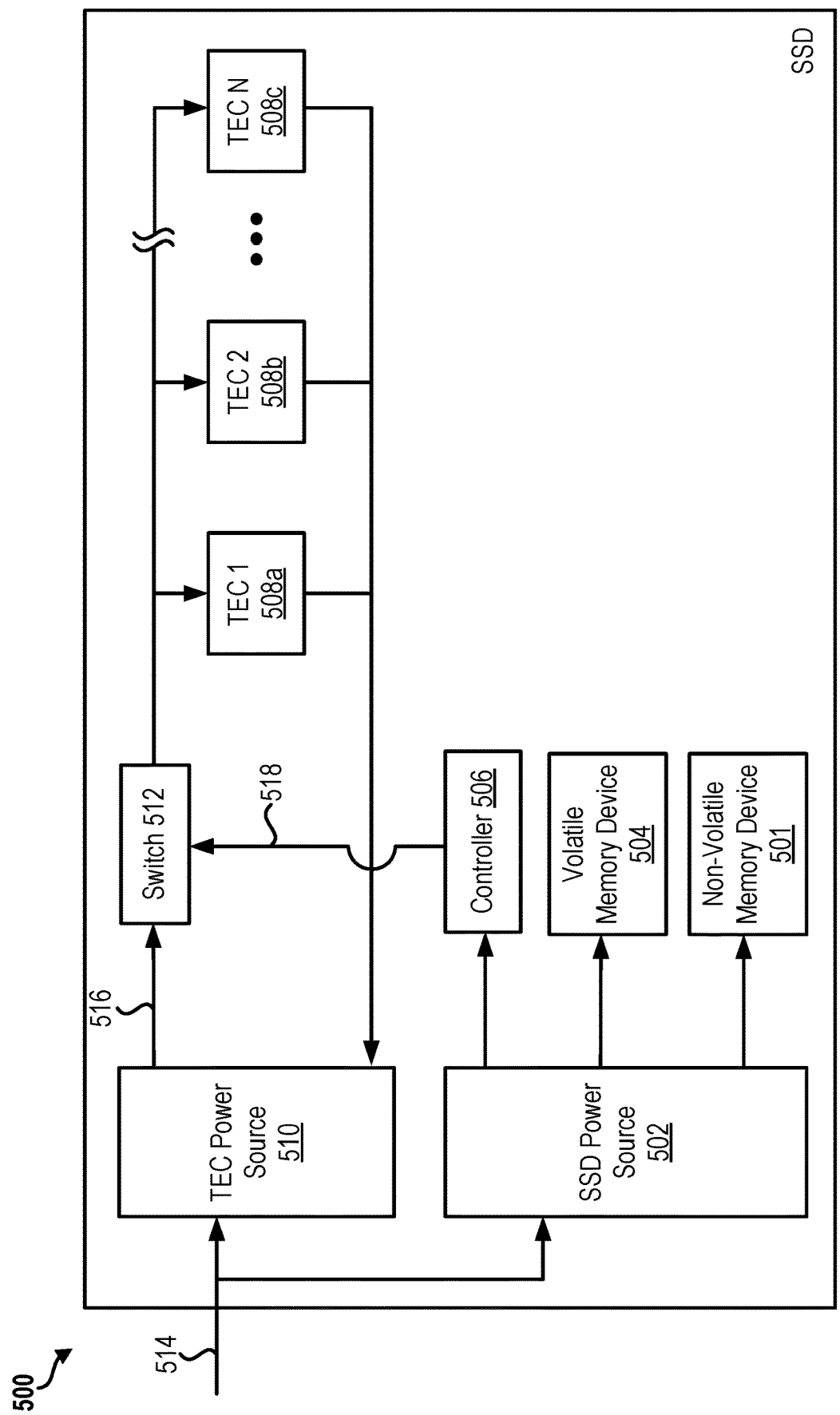
FIG. 5 is a block diagram of an exemplary SSD in accordance with some aspects of the disclosure.

FIG. 5 is a block diagram of an exemplary solid state device (SSD) 500 in accordance with some aspects of the disclosure. As shown in FIG. 5, the SSD 500 includes an SSD power source 502, a non-volatile memory device 501, a volatile memory device 504, a controller 506, a thermoelectric cooler (TEC) power source 510, a switch 512, and thermoelectric cooler (TEC) devices 508a, 508b, and 508c. The SSD power source 502 may receive input power 514 and may provide power to components of the SSD 500, such as the controller 506, the non-volatile memory device 501, and the volatile memory device 504. In the aspect shown in FIG. 5, the TEC devices 508a, 508b, and 508c are coupled to the TEC power source 510 in a parallel configuration via the switch 512. Therefore, the TEC devices 508a, 508b, and 508c may be concurrently activated when the switch 512 is closed (e.g., when the switch 512 is activated or turned ON) and power 516 from the TEC power source 510 is provided to the TEC devices 508a, 508b, and 508c. In some aspects of the disclosure, the controller 506 may activate or deactivate the TEC devices 508a, 508b, and 508c by opening or closing the switch 512 via the signal 518. In some aspects of the disclosure, the non-volatile memory device 501 in FIG. 5 may correspond to the non-volatile memory device 212 in FIG. 2, the volatile memory device 504 in FIG. 5 may correspond to the volatile memory device 210 in FIG. 2, the controller 506 in FIG. 5 may correspond to the controller 208 in FIG. 2, and the TEC devices 508a, 508b, and 508c in FIG. 5 may respectively correspond to the TEC devices 218a, 218b, 218c in FIG. 2.

Figure 6:
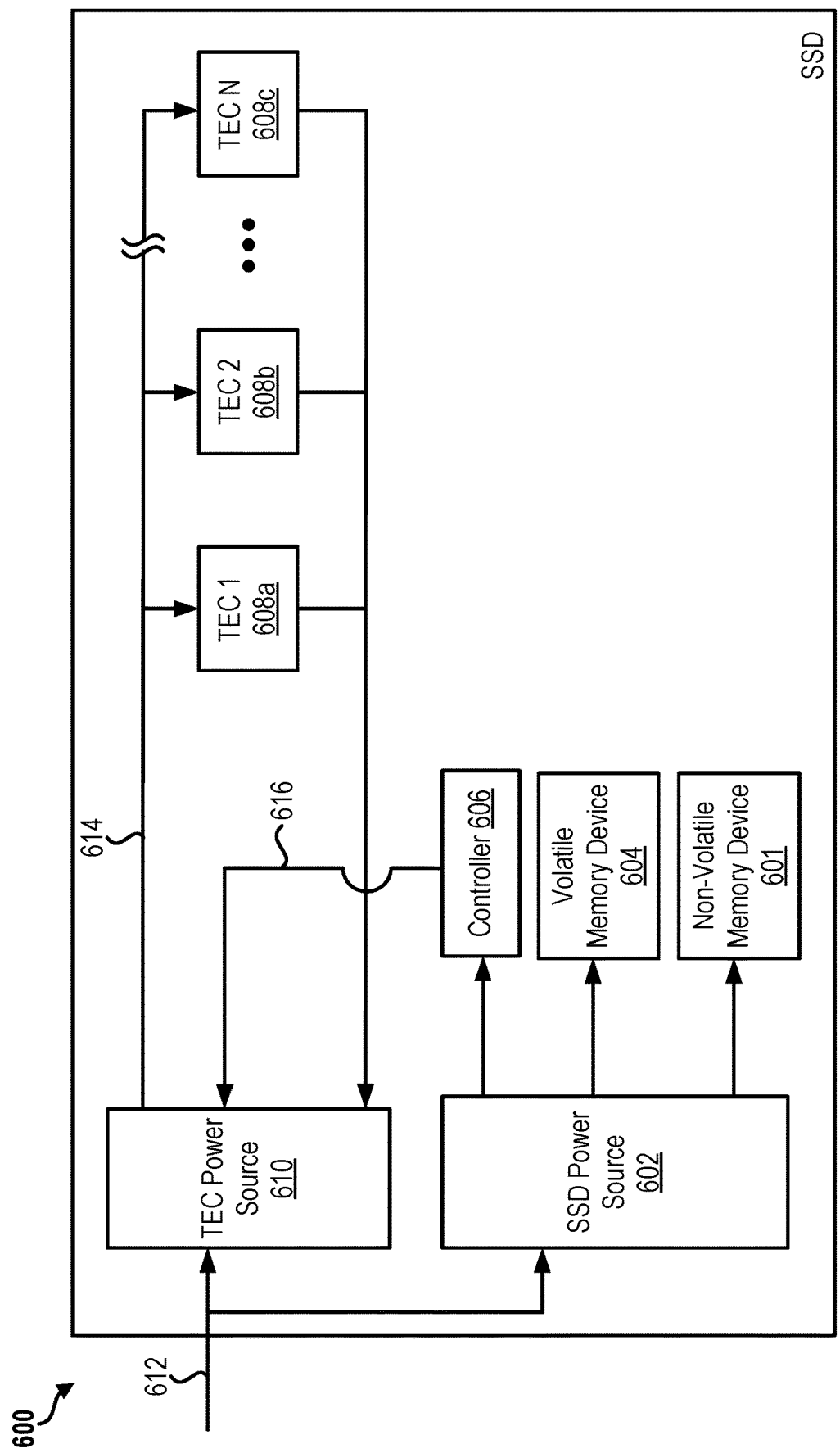
FIG. 6 is a block diagram of an exemplary SSD in accordance with some aspects of the disclosure.

FIG. 6 is a block diagram of an exemplary solid state device (SSD) 600 in accordance with some aspects of the disclosure. As shown in FIG. 6, the SSD 600 includes an SSD power source 602, a non-volatile memory device 601, a volatile memory device 604, a controller 606, a thermoelectric cooler (TEC) power source 610, and thermoelectric cooler (TEC) devices 608a, 608b, and 608c. The SSD power source 602 may receive input power 612 and may provide power to components of the SSD 600, such as the controller 606, the non-volatile memory device 601, and the volatile memory device 604. In the aspect shown in FIG. 6, the TEC devices 608a, 608b, and 608c are coupled to the TEC power source 610 in a parallel configuration. Therefore, the TEC devices 608a, 608b, and 608c may be concurrently activated when the TEC power source 610 provides power 614 to the TEC devices 608a, 608b, and 608c. In some aspects of the disclosure, the controller 606 may activate or deactivate the TEC devices 608a, 608b, and 608c by instructing the TEC power source 610 to enable or disable the power 614. In some aspects, the controller 606 may instruct the TEC power source 610 to enable or disable the power 614 via the control signal 616. For example, the control signal 616 may be an Inter-Integrated Circuit (I2C) signal. In some aspects of the disclosure, the controller 606 may further instruct the TEC power source 610 to increase the power 614 (e.g., to increase the voltage output from the TEC power source 610) delivered to the TEC devices 608a, 608b, and 608c or decrease the power 614 (e.g., to decrease the voltage output from the TEC power source 610) delivered to the TEC devices 608a, 608b, and 608c via the control signal 616. In some aspects of the disclosure, the non-volatile memory device 601 in FIG. 6 may correspond to the non-volatile memory device 212 in FIG. 2, the volatile memory device 604 in FIG. 6 may correspond to the volatile memory device 210 in FIG. 2, the controller 606 in FIG. 6 may correspond to the controller 208 in FIG. 2, and the TEC devices 608a, 608b, and 608c in FIG. 6 may respectively correspond to the TEC devices 218a, 218b, 218c in FIG. 2.

Figure 7:
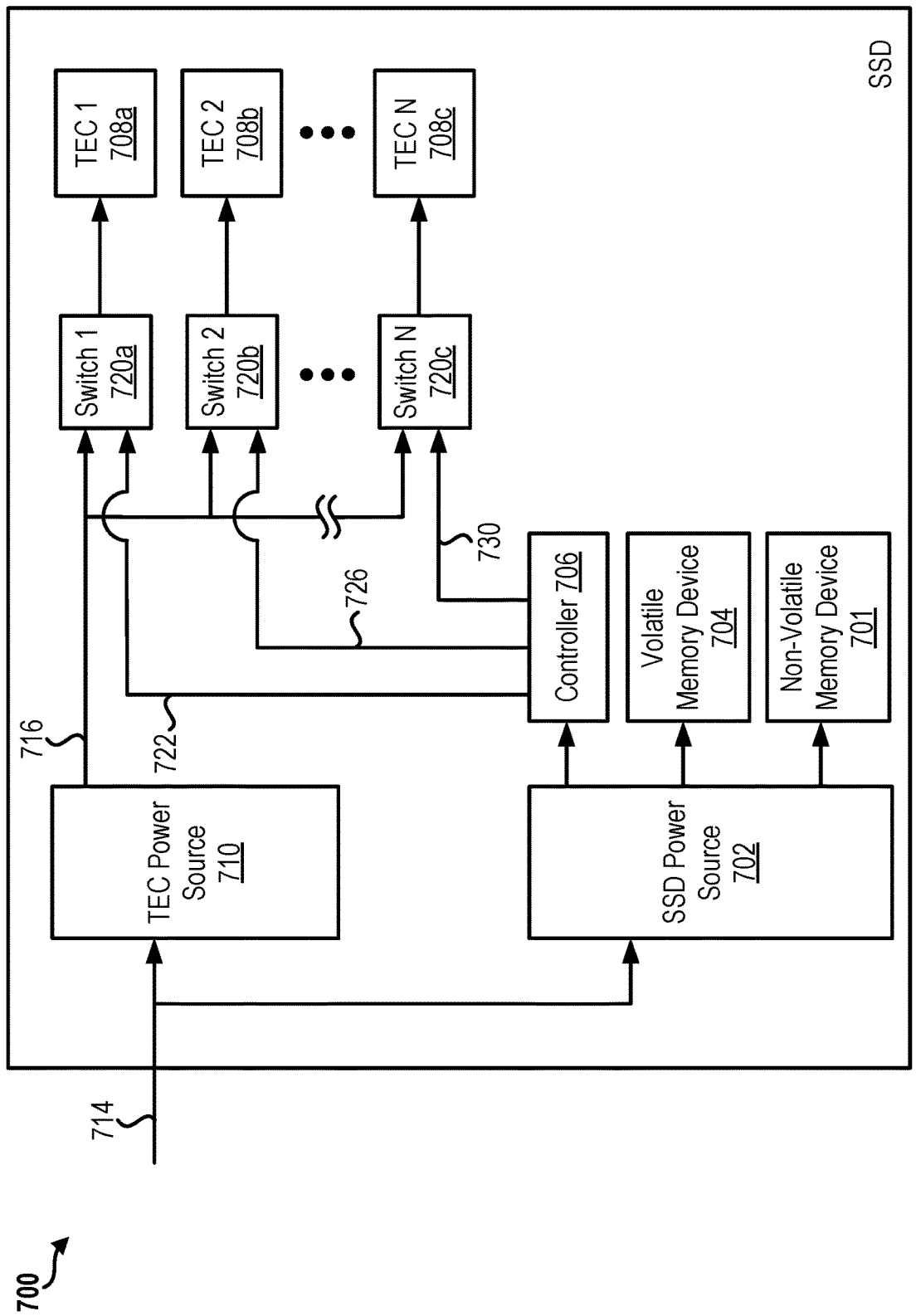
FIG. 7 is a block diagram of an exemplary SSD in accordance with some aspects of the disclosure.

FIG. 7 is a block diagram of an exemplary solid state device (SSD) 700 in accordance with some aspects of the disclosure. As shown in FIG. 7, the SSD 700 includes an SSD power source 702, a non-volatile memory device 701, a volatile memory device 704, a controller 706, a thermoelectric cooler (TEC) power source 710, switches 720a, 720b, and 720c, TEC devices 708a, 708b, and 708c. The SSD power source 702 may receive input power 714 and may provide power to components of the SSD 700, such as the controller 706, the non-volatile memory device 701, and the volatile memory device 704. In the aspect shown in FIG. 7, the TEC devices 708a, 708b, and 708c are coupled to the TEC power source 710 in a parallel configuration via respective switches 720a, 720b, and 720c. Therefore, in some aspects, one or more of the TEC devices 708a, 708b, 708c may be selectively activated when a corresponding switch (e.g., switch 720a, 720b, and/or 720c) is closed (e.g., activated or turned ON) to enable delivery of power 716 from the TEC power source 710. In some aspects of the disclosure, the controller 706 may activate or deactivate the TEC devices 708a, 708b, and/or 708c by opening or closing a corresponding switch (e.g., switch 720a, 720b, and/or 720c) via a corresponding control signal 722, 726, and/or 730. In some aspects of the disclosure, the non-volatile memory device 701 in FIG. 7 may correspond to the non-volatile memory device 212 in FIG. 2, the volatile memory device 704 in FIG. 7 may correspond to the volatile memory device 210 in FIG. 2, the controller 706 in FIG. 7 may correspond to the controller 208 in FIG. 2, and the TEC devices 708a, 708b, and 708c in FIG. 7 may respectively correspond to the TEC devices 218a, 218b, 218c in FIG. 2.

Figure 8:
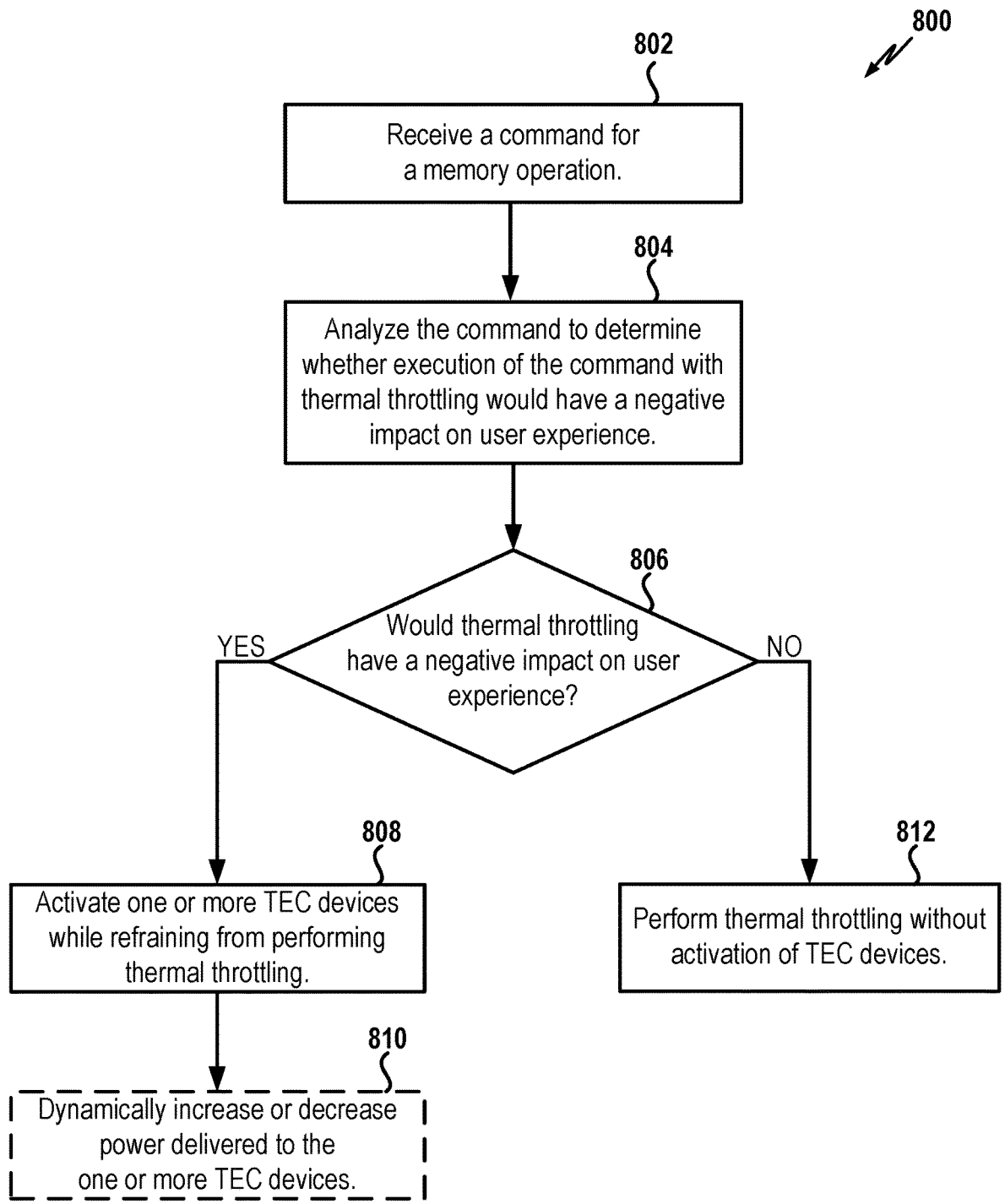
FIG. 8 broadly summarizes exemplary operations for use by a controller of an SSD.

FIG. 8 broadly summarizes exemplary operations 800 for use by a controller of an SSD. It should be noted that operations indicated with dashed lines in FIG. 8 represent operations that are optional. Briefly, at 802, the controller (e.g., the controller 108, 208) receives a command for a memory operation. For example, the command may be from a host device (e.g., the host device 102) for reading data from a non-volatile memory device (e.g., the non-volatile memory device 114, 212). At 804, the controller analyzes the command to determine whether execution of the command with thermal throttling would have a negative impact on the user experience. In one exemplary approach, the controller may analyze the command by comparing a known or expected execution duration of the command to a threshold execution duration. The controller may determine that execution of the command with thermal throttling would have a negative impact on the user experience when the known or expected execution duration exceeds the threshold execution duration, or may determine that the execution of the command with the thermal throttling would not have a negative impact on the user experience when the known or expected execution duration is less than or equal to the threshold execution duration. At 806, if the controller has determined that performing thermal throttling would have a negative impact on the user experience, then at 808, the controller activates one or more TEC devices (e.g., while refraining from performing thermal throttling when executing the command). At 810, the controller dynamically increases or decreases power delivered to the one or more TEC devices (e.g., TEC device(s) 118, TEC devices 218*a*, 218*b*, 218*c*). In some aspects, the controller increases or decreases the power delivered to the one or more TEC devices based on the command. For example, the delivered power may be increased for a command associated with higher power consumption, such as a read command, or decreased for a command associated with lower power consumption, such as a write command. At 806, if the controller has determined that performing thermal throttling would not have a negative impact on the user experience, then at 812, the controller performs thermal throttling when executing the command and without activating any of the TEC devices.

Figure 12:
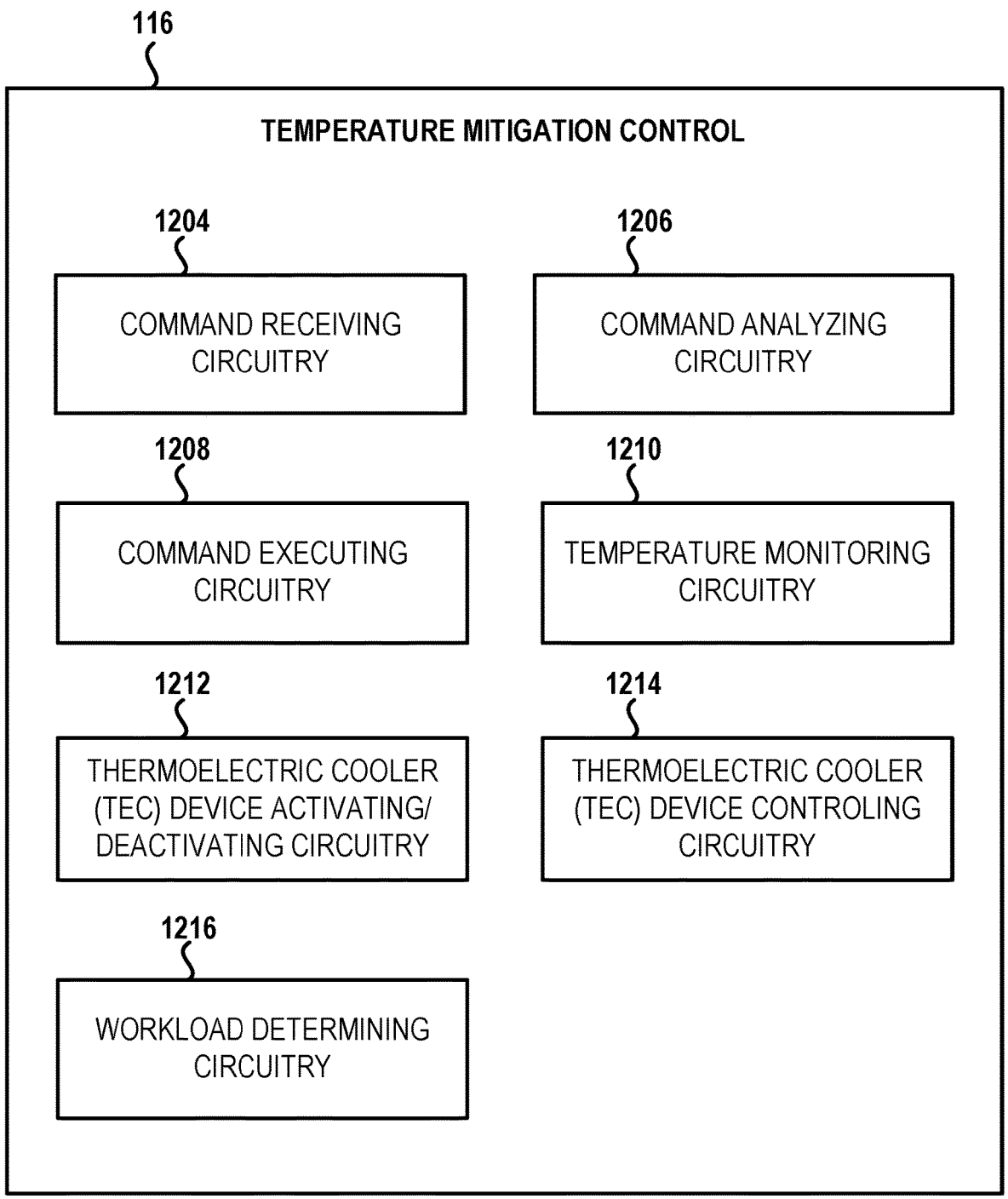
FIG. 12 broadly illustrates a temperature mitigation control block of an SSD.

In at least some examples, means may be provided for performing the functions illustrated in FIG. 8 and/or other functions illustrated or described herein. For example, an apparatus (e.g. the controller 208 of FIG. 2) may be provided for use with a memory device (e.g. the non-volatile memory device 212) where the apparatus includes: means for receiving a command for a memory operation (where the means for receiving may be, e.g., the command receiving circuitry 1204 in FIG. 12), means for analyzing the command to determine whether execution of the command with thermal throttling would have a negative impact on a user experience (where the means for analyzing may be, e.g., the command analyzing circuitry 1206 in FIG. 12), and means for activating, if performing the thermal throttling would have the negative impact on the user experience, one or more thermoelectric cooler (TEC) devices while refraining from performing the thermal throttling (where the means for activating one or more thermoelectric cooler (TEC) devices may be, e.g., the thermoelectric cooler (TEC) device activating/deactivating circuitry 1212 in FIG. 12). In some aspects, the apparatus further includes means for dynamically controlling an amount of power delivered to the one or more TEC devices that have been activated based on the command (where the means for dynamically controlling may be, e.g., the thermoelectric cooler (TEC) device controlling circuitry 1214 in FIG. 12).

Figure 9:
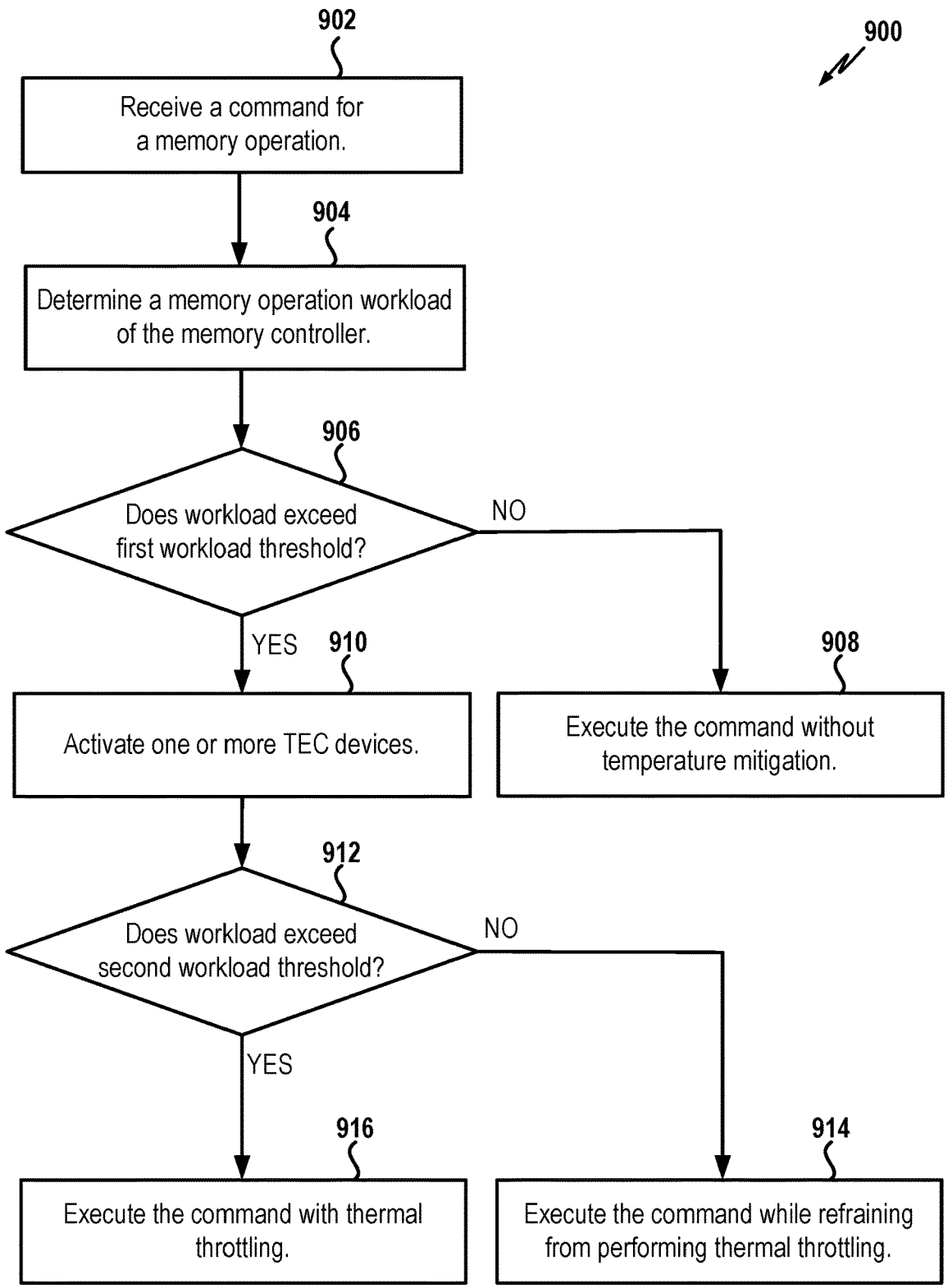
FIG. 9 broadly summarizes exemplary operations for use by a controller of an SSD.

FIG. 9 broadly summarizes exemplary operations 900 for use by a controller of an SSD. Briefly, at 902, the controller (e.g., the controller 108, 208) receives a command for a memory operation. For example, the command may be from a host device (e.g., the host device 102) for reading data from a non-volatile memory device (e.g., the non-volatile memory device 114, 212). At 904, the controller determines a memory operation workload of the controller. At 906, the controller determines whether the memory operation workload exceeds a first workload threshold. If the memory operation workload does not exceed the first workload threshold, then at 908, the controller executes the command without temperature mitigation. If the memory operation workload exceeds the first workload threshold, then at 910, the controller activates one or more TEC devices. At 912, the controller determines whether the memory operation workload exceeds a second workload threshold. If the memory operation workload does not exceed the second workload threshold, then at 914, the controller executes the command while refraining from performing thermal throttling. If the memory operation workload exceeds the second workload threshold, then at 916, the controller executes the command with thermal throttling. It should be noted that the one or more TEC devices may remain activated while the command is executed in operation 914 or operation 916.

In at least some examples, means may be provided for performing the functions illustrated in FIG. 9 and/or other functions illustrated or described herein. For example, an apparatus (e.g. the controller 204 of FIG. 2) may be provided for use with a memory device (e.g. the non-volatile memory device 212) where the apparatus includes: means for receiving a command for a memory operation (where the means for receiving may be, e.g., the command receiving circuitry 1204 in FIG. 12), means for determining a memory operation workload of the controller (where the means for determining may be, e.g., the workload determining circuitry 1216 in FIG. 12), means for determining whether the memory operation workload exceeds a first workload threshold and/or a second workload threshold (where the means for determining may be, e.g., the workload determining circuitry 1216 in FIG. 12), means for executing the command without temperature mitigation (where the means for executing may be, e.g., the command executing circuitry 1208 in FIG. 12), means for activating one or more TEC devices (where the means for activating may be, e.g., the thermoelectric cooler (TEC) device activating/deactivating circuitry 1212 in FIG. 12), means for executing the command while refraining from performing thermal throttling (where the means for executing the command while refraining from performing thermal throttling may be, e.g., the command executing circuitry 1208 in FIG. 12), and means for executing the command with thermal throttling (where the means for executing the command with thermal throttling may be, e.g., the command executing circuitry 1208 in FIG. 12).

Figure 10:
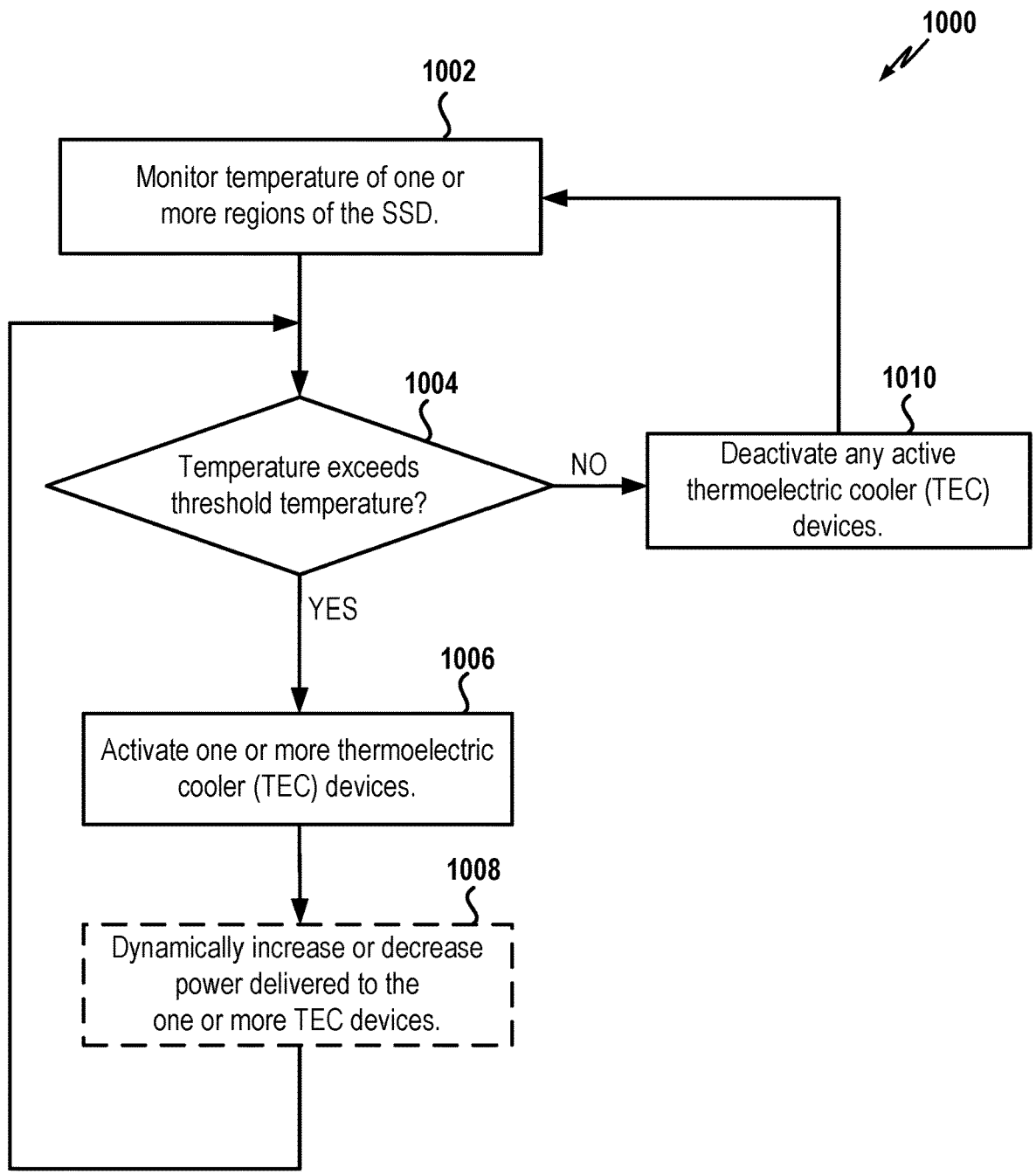
FIG. 10 broadly summarizes exemplary operations for use by a controller of an SSD.

FIG. 10 broadly summarizes exemplary operations 1000 for use by a controller of an SSD. It should be noted that operations indicated with dashed lines in FIG. 10 represent operations that are optional. Briefly, at 1002, the controller (e.g., the controller 108, 208) monitors the temperature of one or more regions of the SSD. At 1004, the controller determines whether the temperature exceeds a threshold temperature. If the controller determines that the temperature exceeds the threshold temperature, then at 1006, the controller activates one or more thermoelectric cooler (TEC) devices. At 1008, the controller dynamically increases or decreases power delivered to the one or more TEC devices. For example, the controller increases an amount of power delivered to the one or more TEC devices that have been activated if the temperature does not decrease after a first period of time, or decreases an amount of power delivered to the one or more TEC devices that have been activated if the temperature does not increase after a second period of time. If the controller determines that the temperature does not exceed the threshold temperature, then at 1010, the controller deactivates any active thermoelectric cooler (TEC) devices.

In at least some examples, means may be provided for performing the functions illustrated in FIG. 10 and/or other functions illustrated or described herein. For example, an apparatus (e.g. the controller 204 of FIG. 2) may be provided for use with a memory device (e.g. the non-volatile memory device 212) where the apparatus includes: means for monitoring a temperature of one or more regions of the SSD (where the means for monitoring may be, e.g., the temperature monitoring circuitry 1210 in FIG. 12), means for determining whether the temperature exceeds a threshold temperature (where the means for determining may be, e.g., the temperature monitoring circuitry 1210 in FIG. 12 in FIG. 12), means for activating one or more thermoelectric cooler (TEC) devices to mitigate the temperature when the temperature exceeds the threshold temperature (where the means for activating may be, e.g., the thermoelectric cooler (TEC) device activating/deactivating circuitry 1212 in FIG. 12), means for deactivating the one or more thermoelectric cooler (TEC) devices that have been activated when the temperature no longer exceeds the threshold temperature (where the means for deactivating may be, e.g., the thermoelectric cooler (TEC) device activating/deactivating circuitry 1212 in FIG. 12)

Figure 11:
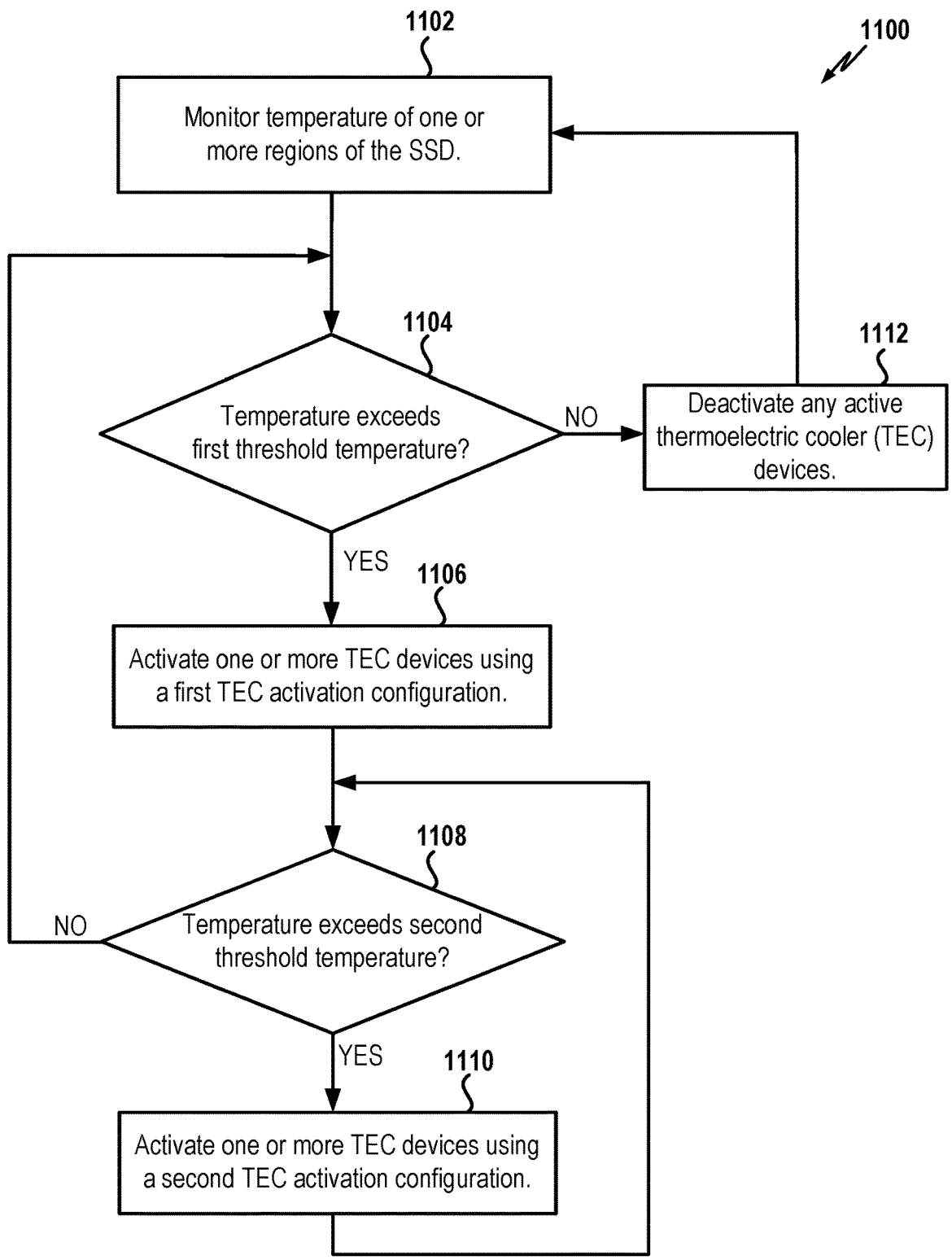
FIG. 11 broadly summarizes exemplary operations for use by a controller of an SSD.

FIG. 11 broadly summarizes exemplary operations 1100 for use by a controller of an SSD. Briefly, at 1102, the controller (e.g., the controller 108, 208) monitors the temperature of one or more regions of the SSD. At 1104, the controller determines whether the temperature exceeds a first threshold temperature. If the controller determines that the temperature does not exceed the first threshold temperature, the controller at 1112 may deactivate any active thermoelectric cooler (TEC) devices and may continue to monitor the temperature. If the controller determines that the temperature exceeds the first threshold temperature, then at 1106, the controller activates one or more thermoelectric cooler (TEC) devices using a first TEC activation configuration. At 1108, the controller determines whether the temperature exceeds a second threshold temperature. If the temperature exceeds the second threshold temperature, then at 1110, the controller activates one or more thermoelectric cooler (TEC) devices using a second TEC activation configuration. If the temperature does not exceed the second threshold temperature, the controller returns to operation 1104 to determine whether the temperature exceeds the first threshold temperature. In some aspects, the first TEC activation configuration delivers a first amount of power to the one or more TEC devices, and the second TEC activation configuration delivers a second amount of power to the one or more TEC devices. The second amount of power may be greater than the first amount of power. In some aspects, the one or more TEC devices are located at or proximate to one or more heat generating components of the SSD.

In at least some examples, means may be provided for performing the functions illustrated in FIG. 11 and/or other functions illustrated or described herein. For example, an apparatus (e.g. the controller 204 of FIG. 2) may be provided for use with a memory device (e.g. the non-volatile memory device 212) where the apparatus includes: means for monitoring a temperature of one or more regions of the SSD (where the means for monitoring may be, e.g., the temperature monitoring circuitry 1210 in FIG. 12), means for determining whether the temperature exceeds a first threshold temperature and/or a second threshold temperature (where the means for determining may be, e.g., the temperature monitoring circuitry 1210 in FIG. 12), means for activating one or more thermoelectric cooler (TEC) devices when the temperature exceeds at least one of the first threshold temperature or the second threshold temperature, where the one or more TEC devices are activated using a first TEC activation configuration when the temperature exceeds the first threshold temperature, and where the one or more TEC devices are activated using a second TEC activation configuration when the temperature exceeds the second threshold temperature (where the means for activating may be, e.g., the thermoelectric cooler (TEC) device activating/deactivating circuitry 1212 in FIG. 12), and means for deactivating the one or more TEC devices that have been activated when the temperature no longer exceeds the first threshold temperature (where the means for deactivating may be, e.g., the thermoelectric cooler (TEC) device activating/deactivating circuitry 1212 in FIG. 12).

In some aspects of the disclosure, and as previously described with reference to FIG. 1, the controller 108 may include the temperature mitigation control block 116. The temperature mitigation control block 116 may be implemented in software, hardware, firmware, or a combination thereof to perform various functions described herein for mitigating the temperature of an SSD. In some further aspects of the disclosure, with reference to FIG. 12, the temperature mitigation control block 116 may include command receiving circuitry 1204, command analyzing circuitry 1206, command executing circuitry 1208, temperature monitoring circuitry 1210, thermoelectric cooler (TEC) device activating/deactivating circuitry 1212, thermoelectric cooler (TEC) device controlling circuitry 1214, and workload determining circuitry 1216.

The command receiving circuitry 1204 may be configured to receive a command for a memory operation. The command analyzing circuitry 1206 may be configured to analyze a command to determine whether execution of the command with thermal throttling would have a negative impact on a user experience. The command executing circuitry 1208 may be configured to execute a command In some aspects, the command may be executed while refraining from performing thermal throttling (e.g., when the memory operation workload of the controller exceeds a first workload threshold), or the command may be executed with thermal throttling (e.g., when the memory operation workload exceeds the second workload threshold). The temperature monitoring circuitry 1210 may be configured to monitor a temperature of one or more regions of the SSD. In some aspects, the temperature monitoring circuitry 1210 may be further configured to determine whether the temperature exceeds a threshold temperature and/or to determine whether the temperature exceeds at least one of a first threshold temperature or a second threshold temperature.

The thermoelectric cooler (TEC) device activating/deactivating circuitry 1212 may be configured to activate one or more thermoelectric cooler (TEC) devices. In some aspects, the thermoelectric cooler (TEC) device activating/deactivating circuitry 1212 may be configured to activate one or more thermoelectric cooler (TEC) devices when the memory operation workload of the controller exceeds at least one of a first workload threshold or a second workload threshold. In some aspects, the thermoelectric cooler (TEC) device activating/deactivating circuitry 1212 may be configured to activate one or more thermoelectric cooler (TEC) devices to mitigate the temperature when the temperature exceeds a threshold temperature and to deactivate the one or more thermoelectric cooler (TEC) devices that have been activated when the temperature no longer exceeds the threshold temperature. In some aspects, the thermoelectric cooler (TEC) device activating/deactivating circuitry 1212 may be configured to activate one or more thermoelectric cooler (TEC) devices when the temperature exceeds at least one of a first threshold temperature or a second threshold temperature such that the one or more TEC devices are activated using a first TEC activation configuration when the temperature exceeds the first threshold temperature, and the one or more TEC devices are activated using a second TEC activation configuration when the temperature exceeds the second threshold temperature. In some aspects, the first TEC activation configuration may deliver a first amount of power to the one or more TEC devices, and the second TEC activation configuration may deliver a second amount of power to the one or more TEC devices.

The thermoelectric cooler (TEC) device controlling circuitry 1214 may be configured to increase an amount of power delivered to the one or more TEC devices that have been activated if the temperature does not decrease after a first period of time, and may decrease an amount of power delivered to the one or more TEC devices that have been activated if the temperature does not increase after a second period of time. The workload determining circuitry 1216 may be configured to determine a memory operation workload of the controller. In some aspects, the workload determining circuitry 1216 may be further configured to determine whether the memory operation workload of the controller exceeds a first workload threshold and/or a second workload threshold.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

What is claimed is:

1. A data storage device configured to manage a temperature of the data storage device, the data storage device comprising:
a non-volatile memory (NVM) comprising at least one NAND memory;
a controller coupled to the NVM;
a plurality of temperature sensors, including a first temperature sensor for the NVM and a second temperature sensor for the controller;
a plurality of thermoelectric cooler (TEC) devices, including a first TEC device at the NVM and a second TEC device at the controller;
wherein the controller comprises:
a command circuitry configured to receive and execute a command from a host device for a memory operation to be performed using the NVM, the memory operation corresponding to one of a read command or a write command;
a temperature monitoring circuitry coupled to the plurality of temperature sensors and configured to monitor a plurality of temperatures, including a NVM temperature corresponding to a temperature measured by the first temperature sensor, and a controller temperature corresponding to a temperature measured by the second temperature sensor;
a determiner circuitry configured to determine whether a monitored temperature corresponding to one of the NVM temperature or the controller temperature exceeds a threshold temperature;

an activation circuitry coupled to the plurality of TEC devices and configured to:
  activate one or more of the plurality of TEC devices to mitigate the temperature responsive to the monitored temperature exceeding the threshold temperature; and
  deactivate the one or more of the plurality of TEC devices that have been activated responsive to the monitored temperature no longer exceeding the threshold temperature; and
a thermoelectric cooler (TEC) device controller circuitry configured to:
  increase an amount of power delivered to the one or more of the plurality of TEC devices that have been activated responsive to the monitored temperature, corresponding to one of the NVM temperature or the controller temperature, not decreasing after a first period of time; and
  decrease an amount of power delivered to the one or more of the plurality of TEC devices that have been activated responsive to the monitored temperature, corresponding to one of the NVM temperature or the controller temperature, not increasing after a second period of time.

2. An apparatus configured to manage a temperature of a data storage device based on one or both of thermoelectric cooling and thermal throttling, the apparatus comprising:
a non-volatile memory (NVM) comprising at least one NAND memory;
a processor coupled to the NVM;
a plurality of temperature sensors, including a first temperature sensor for the NVM and a second temperature sensor for the processor; and
a plurality of thermoelectric cooler (TEC) devices, including a first TEC device at the NVM and a second TEC device at the processor;
wherein the processor comprises:
  means for receiving and executing a command from a host device for a memory operation to be performed using the NVM, the memory operation corresponding to one of a read command or a write command;
  means for monitoring a plurality of temperatures, including a NVM temperature corresponding to a temperature measured by the first temperature sensor, and a processor temperature corresponding to a temperature measured by the second temperature sensor;
  means for determining whether a monitored temperature corresponding to one of the NVM temperature or the processor temperature exceeds a threshold temperature;
  means for activating one or more of the plurality of TEC devices to mitigate the temperature responsive to the monitored temperature, corresponding to one of the NVM temperature or the processor temperature, exceeding a threshold temperature;
  means for deactivating the one or more of the plurality of TEC devices that have been activated responsive to the monitored temperature, corresponding to one of the NVM temperature or the processor temperature, no longer exceeding the threshold temperature;
  means for increasing an amount of power delivered to the one or more of the plurality of TEC devices that have been activated responsive to the monitored temperature, corresponding to one of the NVM temperature or the processor temperature, not decreasing after a first period of time; and
  means for decreasing an amount of power delivered to the one or more of the plurality of TEC devices that have been activated responsive to the monitored temperature, corresponding to one of the NVM temperature or the processor temperature, not increasing after a second period of time.

3. A method of operating a data storage device to manage a temperature of the data storage device, wherein the data storage device comprises a non-volatile memory (NVM) and is configured to execute commands and to perform thermal throttling, the method comprising:
receiving, at a controller of the data storage device, a command from a host device for a memory operation to be performed using the NVM, the memory operation corresponding to one of a read command or a write command;
analyzing, at the controller and without executing the command, the command by comparing an expected execution duration of the command with a threshold execution duration to determine one of: that execution of the command with thermal throttling would result in a negative impact on a user experience responsive to the expected execution duration exceeding the threshold execution duration, and that execution of the command with thermal throttling would not result in a negative impact on a user experience responsive to the expected execution duration being less than or equal to the threshold execution duration;
activating, in response to determining that execution of the command with the thermal throttling would result in the negative impact on the user experience, one or more thermoelectric cooler (TEC) devices while refraining from performing the thermal throttling; and
performing, in response to determining that execution of the command with the thermal throttling would not result in the negative impact on the user experience, the thermal throttling without activating one or more TEC devices.

4. The method of claim 3, wherein at least one of the one or more TEC devices is thermally coupled to the controller.

5. The method of claim 3, wherein at least one of the one or more TEC devices is thermally coupled to a memory device associated with the memory operation.

6. The method of claim 3, wherein the one or more TEC devices are activated for a period of time.

7. The method of claim 3, further comprising:
dynamically controlling an amount of power delivered to the one or more TEC devices that have been activated.

8. The method of claim 3, wherein the expected execution duration of the command is determined by one or more of: command operation, command stream, block size of data associated with the command, or queue parameters associated with the command.

9. A method of operating a data storage device to manage a temperature of the data storage device, wherein the data storage device comprises a non-volatile memory (NVM) and is configured to execute commands and to perform thermal throttling, the method comprising:
receiving, at a controller of the data storage device, a command from a host device for a memory operation to be performed using the NVM, the memory operation corresponding to one of a read command or a write command;
determining, at the controller, a memory operation workload of the controller, wherein the determining comprises determining at least one of a total number of command queues that have reached a maximum capacity, a total number of queued commands, or a data throughput of the controller;

activating, at the controller and in response to determining the memory operation workload of the controller exceeds a first workload threshold, one or more thermoelectric cooler (TEC) devices while refraining from executing the command;

executing, in response to determining the memory operation workload does not exceed a second workload threshold greater than the first workload threshold, the command while refraining from performing thermal throttling; and executing, in response to determining the memory operation workload exceeds the second workload threshold, the command with the thermal throttling.

10. The method of claim 9, wherein:
the first workload threshold is exceeded responsive to more than a first number of a plurality of command queues having reached maximum capacity;
the second workload threshold is exceeded responsive to more than a second number of the plurality of command queues having reached maximum capacity; and
the second number is greater than the first number.

11. The method of claim 9, wherein the activation of the one or more TEC devices and the refraining from performing the thermal throttling responsive to the memory operation workload exceeding the first workload threshold mitigates a temperature of the data storage device while avoiding a negative impact on a user experience.

12. The method of claim 9, wherein activating the one or more TEC devices comprises:
providing a first amount of power to the one or more TEC devices responsive to the memory operation workload of the controller exceeding the first workload threshold; and
providing a second amount of power to the one or more TEC devices responsive to the memory operation workload of the controller exceeding the second workload threshold, wherein the second amount of power is greater than the first amount of power.

13. A data storage device configured to perform thermal throttling, the data storage device comprising:
a non-volatile memory (NVM);
one or more thermoelectric cooler (TEC) devices; and
a controller coupled to the NVM and the one or more TEC devices;
wherein the controller is configured to:
receive a command from a host device for a memory operation to be performed using the NVM, the memory operation corresponding to one of a read command or a write command;
analyze the command without executing the command by comparing an expected execution duration of the command with a threshold execution duration to determine one of:
that execution of the command with thermal throttling would result in a negative impact on a user experience responsive to the expected execution duration exceeding the threshold execution duration, and
that execution of the command with thermal throttling would not result in a negative impact on a user experience responsive to the expected execution duration being less than or equal to the threshold execution duration;
activate, in response to determining that execution of the command with the thermal throttling would result in the negative impact on the user experience, at least one of the one or more TEC devices while refraining from performing the thermal throttling; and
perform, in response to determining that execution of the command with the thermal throttling would not result in the negative impact on the user experience, the thermal throttling without activating the one or more TEC devices.

14. The data storage device of claim 13, wherein at least one of the one or more TEC devices is thermally coupled to the controller.

15. The data storage device of claim 13, wherein at least one of the one or more TEC devices is thermally coupled to a memory device associated with the memory operation.

16. The data storage device of claim 13, wherein the one or more TEC devices are located at or proximate to one or more heat generating components of the data storage device.

17. The data storage device of claim 13, wherein the controller is further configured to activate the one or more TEC devices for a period of time.

18. The data storage device of claim 13, wherein the controller is further configured to:
dynamically control an amount of power delivered to the one or more TEC devices that have been activated.

19. The data storage device of claim 18, wherein the controller is further configured to:
increase, in response to the command being a read command, the amount of power delivered to the one or more TEC devices; and
decrease, in response to the command being a write command, the amount of power delivered to the one or more TEC devices.

20. The data storage device of claim 13, wherein the expected execution duration of the command is determined by one or more of: command operation, command stream, block size of data associated with the command, or queue parameters associated with the command.

21. A data storage device configured to perform thermal throttling, the data storage device comprising:
a non-volatile memory (NVM);
one or more thermoelectric cooler (TEC) devices; and
a controller coupled to the NVM and the one or more TEC devices;
wherein the controller is configured to:
receive a command from a host device for a memory operation to be performed using the NVM, the memory operation corresponding to one of a read command or a write command;
determine a memory operation workload of the controller, wherein the determining comprises determining at least one of a total number of command queues that have reached a maximum capacity, a total number of queued commands, or a data throughput of the controller;
activate, in response to determining the memory operation workload of the controller exceeds a first workload threshold, one or more thermoelectric cooler (TEC) devices while refraining from executing the command;
execute, in response to determining the memory operation workload does not exceed a second workload threshold greater than the first workload threshold, the command while refraining from performing thermal throttling; and execute, in response to determining the memory operation workload exceeds the second workload threshold, the command with the thermal throttling.

22. The data storage device of claim 21, wherein:
the first workload threshold is exceeded responsive to more than a first number of a plurality of command queues having reached maximum capacity;
the second workload threshold is exceeded responsive to more than a second number of the plurality of command queues having reached maximum capacity; and
the second number is greater than the first number.

23. The data storage device of claim 21, wherein the activation of the one or more TEC devices and the refraining from performing the thermal throttling responsive to the memory operation workload exceeding the first workload threshold are configured to mitigate a temperature of the data storage device while avoiding a negative impact on a user experience.

24. The data storage device of claim 21, wherein the controller activates the one or more TEC devices by being further configured to:
provide a first amount of power to the one or more TEC devices responsive to the memory operation workload of the controller exceeding the first workload threshold; and
provide a second amount of power to the one or more TEC devices responsive to the memory operation workload of the controller exceeding the second workload threshold, wherein the second amount of power is greater than the first amount of power.

25. The data storage device of claim 21, wherein at least one of the one or more TEC devices is thermally coupled to the controller.

26. The data storage device of claim 21, wherein at least one of the one or more TEC devices is thermally coupled to a memory device associated with the memory operation.

27. The data storage device of claim 21, wherein the one or more TEC devices are located at or proximate to one or more heat generating components of the data storage device.

28. The data storage device of claim 21, wherein the controller is further configured to activate the one or more TEC devices for a period of time.

29. The data storage device of claim 21, wherein the controller is further configured to:
dynamically control an amount of power delivered to the one or more TEC devices that have been activated.

* * * * *